United States Patent
Chang et al.

(10) Patent No.: US 7,453,085 B2
(45) Date of Patent: Nov. 18, 2008

(54) NANO-ELASTIC MEMORY DEVICE AND METHOD OF MANUFACTURING THE SAME

(75) Inventors: Joo-han Chang, New York, NY (US); Dong-hun Kang, Yongin-si (KR); Young-kwan Cha, Yongin-si (KR); Wan-jun Park, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 151 days.

(21) Appl. No.: 11/505,970

(22) Filed: Aug. 18, 2006

(65) Prior Publication Data
US 2007/0045691 A1 Mar. 1, 2007

(30) Foreign Application Priority Data
Aug. 31, 2005 (KR) .................. 10-2005-0080620

(51) Int. Cl.
*H01L 29/06* (2006.01)
*H01L 29/08* (2006.01)
*H01L 31/0352* (2006.01)

(52) U.S. Cl. .................. 257/41; 257/415; 257/E51.04; 977/742; 977/743

(58) Field of Classification Search .................. None
See application file for complete search history.

(56) References Cited

U.S. PATENT DOCUMENTS

| 6,558,645 | B2 | 5/2003 | Nakayama et al. |
| 6,574,130 | B2 | 6/2003 | Segal et al. |
| 6,856,002 | B2 * | 2/2005 | Moore et al. .................. 257/529 |
| 7,268,077 | B2 * | 9/2007 | Hwang .................. 438/680 |
| 7,274,035 | B2 * | 9/2007 | Yang et al. .................. 257/27 |
| 2005/0017370 | A1 * | 1/2005 | Stasiak .................. 257/777 |

* cited by examiner

*Primary Examiner*—Ngan Ngo
(74) *Attorney, Agent, or Firm*—Harness, Dickey & Pierce, P.L.C.

(57) ABSTRACT

A nano-elastic memory device and a method of manufacturing the same. The nano-elastic memory device may include a substrate, a plurality of lower electrodes arranged in parallel on the substrate, a support unit formed of an insulating material to a desired or predetermined thickness on the substrate having cavities that expose the lower electrodes, a nano-elastic body extending perpendicular from a surface of the lower electrodes in the cavities, and a plurality of upper electrodes formed on the support unit and perpendicularly crossing the lower electrodes over the nano-elastic bodies.

17 Claims, 8 Drawing Sheets

NANO-ELASTIC MEMORY DEVICE AND METHOD OF MANUFACTURING THE SAME

PRIORITY STATEMENT

This application claims the benefit of priority to Korean Patent Application No. 10-2005-0080620, filed on Aug. 31, 2005, in the Korean Intellectual Property Office, the entire contents of which is incorporated herein by reference.

BACKGROUND OF THE INVENTION

1. Field of the Invention

Example embodiments of the present invention relate to a nano-elastic memory device and a method of manufacturing the same. More particularly, example embodiments of the present invention are directed to a nano-elastic memory device that has an elastic body between two electrodes, wherein the length of the elastic body varies with an electrostatic force between the two electrodes to electrically connect and disconnect the two electrodes, and a method of manufacturing the same.

2. Description of the Related Art

The development and increasing popularity of electronic products has encouraged the development of memory devices for information storage. These memory devices need to be nonvolatile to retain information even if power is turned off. Also, to be competitive, the memory devices may require lower manufacturing costs, higher integration density, lower power consumption, and/or higher operation speed. A flash memory is an example of a nonvolatile memory device that has a drawback of relatively slow operation speed. Accordingly, various nonvolatile memory devices having a greater capacity than flash memory and the capability of operating at higher speeds have been developed.

Examples of these are magneto-resistance random access memory (MRAM) that uses magnetic spin direction, ferroelectric random access memory (FRAM) that uses the polarization of a ferroelectric material, and a phase change random access memory (PRAM) that uses a thin film phase change material whose phase is changeable by applying energy.

The versatility of carbon nanotubes (CNTs) has been proven in many fields since they were discovered in 1991. A memory device that uses CNTs has been developed as an example of a conventional nonvolatile memory device and is comparable to MRAM, the FRAM, and PRAM. A CNT memory device may make use of the bending characteristics of the CNT according to electrostatic force. CNT memory devices may be formed of CNT ribbons and electrode traces which form a cross-bar shaped array and the CNT ribbon may be formed in a bridge shape by a support unit located between the electrode traces.

The operation principle of the conventional CNT memory device is that if a voltage is applied to the CNT ribbon and another voltage of opposite polarity is applied to the electrode trace by driving a transistor, the CNT ribbon bends due to an electrostatic force and contacts the electrode trace formed between the support units so that the CNT memory device is in an 'ON' state. Alternatively, if voltages of the same polarity are applied to the CNT ribbon and the electrode trace, the CNT ribbon returns to the original position so the memory device is in an 'OFF' state. Accordingly, the convention CNT memory device may store data '1' when the CNT ribbon contacts the electrode trace, and may store data '0' when the CNT ribbon is not in contact with the electrode trace.

The bending of the CNT ribbon may be maintained by Van der Waals' force. The 'ON' state or the 'OFF' state may be read by measuring the resistance of an electrode that connects the electrode trace to the CNT ribbon after a current is supplied to the electrode trace. That is, information may be read by detecting whether the electrodes are connected and allow a current to flow. Once the CNT ribbon is bent, that state may be maintained even if power is turned off, making the convention CNT memory device a nonvolatile memory device.

However, when the conventional CNT memory device operates, memory cells may be affected by an adjacent memory cell due to mutual actions between neighboring memory cells, because more than one of the memory cells of the conventional CNT memory device may be connected by a single CNT. Also, because the conventional CNT has a ribbon or network shape, the driving voltage may be relatively large.

SUMMARY OF THE INVENTION

Example embodiments of the present invention provide a nano-elastic memory device that elastically changes the length of a nanotube, and a method of manufacturing the nano-elastic memory device.

According to an example embodiment of the present invention, there is provided a nano-elastic memory device including: an upper electrode and a lower electrode which are vertically separated and perpendicularly cross each other; and a nano-elastic body grown on either the upper electrode or the lower electrode toward the opposite lower or upper electrode.

In an example embodiment, the nano-elastic body may be formed in a coil shape.

In an example embodiment, the nano-elastic body may be a conductive nanotube and may be a CNT.

In an example embodiment, the nano-elastic memory device may further include a catalyst metal layer on a lower part of the nano-elastic body.

In an example embodiment, the electrode on which the nano-elastic body is formed may be a catalyst metal layer.

In an example embodiment, the upper electrode or the lower electrode may have a stack structure in which a first conductive film, an insulating layer, and a second conductive film are sequentially formed.

In an example embodiment, the nano-elastic memory device may further include a switching device connected to the upper electrode and the lower electrode to selectively change a length of the nano-elastic body.

In an example embodiment, the switching device may be a transistor or a diode.

According to another example embodiment of the present invention, there is provided a nano-elastic memory device including: a substrate; a plurality of lower electrodes arranged in parallel on the substrate; a support unit formed of an insulating material to a desired or predetermined thickness on the substrate having cavities that expose the lower electrodes; a nano-elastic body extending perpendicular from a surface of the lower electrodes in the cavities; and a plurality of upper electrodes formed on the support unit and perpendicularly crossing the lower electrodes over the nano-elastic bodies.

In an example embodiment, the substrate may be a SOI substrate or a silicon substrate.

In an example embodiment, the nano-elastic memory device may further include an insulating layer between the substrate and the lower electrode.

In an example embodiment, the cavity may be elongated along the lower electrode.

In an example embodiment, the cavity may have a contact hole shape or a polygon shape.

In an example embodiment, the nano-elastic body may have a diameter of 1 nm to 1 µm.

In an example embodiment, a plurality of nano-elastic bodies may be provided in a region where the lower electrode and the upper electrode cross each other.

In an example embodiment, the upper electrode may have a stack configuration in which a first conductive film, an insulating layer, and a second conductive film are sequentially formed.

In an example embodiment, the gap between the nano-elastic body and the upper electrode may be 1 nm to 200 nm According to another example embodiment of the present invention, there is provided a method of manufacturing a nano-elastic memory device including: forming a plurality of strip-shaped lower electrodes in parallel on a substrate; forming a support unit having cavities that expose the lower electrodes; forming a plurality of nano-elastic bodies extending perpendicular from a surface of the lower electrodes in the cavities; and forming a plurality of strip-shaped upper electrodes on the support unit at a desired or predetermined interval, perpendicularly crossing the lower electrodes over the nano-elastic bodies.

In an example embodiment, the method may further include forming an insulating layer between the substrate and the lower electrode.

In an example embodiment, the forming of the support unit may include forming the cavities in a length direction of the lower electrode.

In an example embodiment, forming the nano-elastic bodies may include forming catalyst materials for growing the nano-elastic body at a desired or predetermined interval on a surface of the exposed lower electrodes and forming the nano-elastic bodies on the catalyst materials.

In an example embodiment, forming the support unit may include forming the cavity in a contact hole shape.

In an example embodiment, forming the upper electrodes may include: filling cavities with a sacrificial layer; forming a first conductive film on the support unit and the sacrificial layer; forming a first conductive film pattern crossing the lower electrode by performing a patterning process; removing the sacrificial layer; forming an insulating layer on the first conductive film pattern and the support unit; and forming a second conductive film on the insulating layer.

In an example embodiment, forming the upper electrodes may include: filling cavities with a sacrificial layer; sequentially forming a first conductive film, an insulating layer, and a second conductive film on the support unit and the sacrificial layer; forming the upper electrodes by patterning the first conductive film, the insulating layer, and the second conductive film; and removing the sacrificial layer.

According to another example embodiment of the present invention, there is provided a method of manufacturing a nano-elastic memory device, including: forming a lower structure that includes strip-shaped lower electrodes, a support unit, and a nano-elastic body on a first substrate; forming an upper structure that includes strip-shaped upper electrodes on a second substrate; and bonding the first substrate and the second substrate so that the lower electrodes perpendicularly cross the upper electrodes over the nano-elastic body.

In an example embodiment, forming the lower structure may include: forming the lower electrodes arranged in parallel by forming a conductive thin film on a first substrate and patterning the conductive thin film; forming an insulating layer on the lower electrodes; forming a support unit having cavities that expose the lower electrodes in the insulating layer; and forming a nano-elastic body extending perpendicular from a surface of the lower electrodes in the cavity.

In an example embodiment, forming the upper structure may include: sequentially forming a first conductive film, an insulating layer, and a second conductive film; and forming an upper electrode by patterning the first conductive film, the insulating layer, and the second conductive film.

BRIEF DESCRIPTION OF THE DRAWINGS

The above and other features and advantages of example embodiments of the present invention will become more apparent by considering in detail the example embodiments of the present invention in connection with the attached drawings in which.

DETAILED DESCRIPTION OF EXAMPLE EMBODIMENTS OF THE INVENTION

Figure 1:
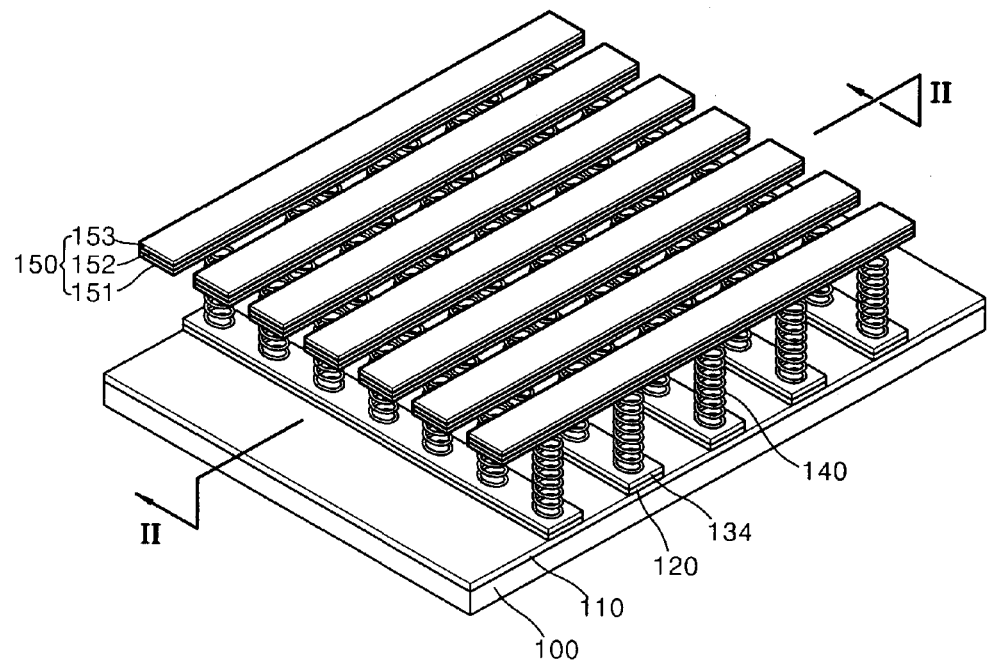
FIG. 1 is a perspective view of an array of nano-elastic memory devices according to an example embodiment of the present invention.

Various example embodiments of the present invention will now be described more fully with reference to the accompanying drawings in which some example embodiments of the present invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the example embodiments of the present invention set forth herein. It should be understood that there is no intent to limit example embodiments of the present invention to the particular forms disclosed, but on the contrary, example embodiments of the present invention are to cover all modifications, equivalents, and alternatives falling within the scope of the invention. Like reference numbers refer to like components throughout the description of the figures.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the example embodiments of the present invention. As used herein, the term "and/or" includes any and all combinations of one or more of the associated listed items.

It will be understood that when a component is referred to as being "connected" or "coupled" to another component, it can be directly connected or coupled to the other component or intervening components may be present. In contrast, when a component is referred to as being "directly connected" or "directly coupled" to another component, there are no intervening components present. Other words used to describe the relationship between components should be interpreted in a like fashion (e.g., "between" versus "directly between", "adjacent" versus "directly adjacent", etc.).

The terminology used herein is for the purpose of describing particular example embodiments only and is not intended to be limiting of the example embodiments of the present invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, and/or components.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments of the present invention, various embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween.

A nano-elastic memory device according to an example embodiment of the present invention that includes and uses a nano-coil will now be described.

Figure 2:
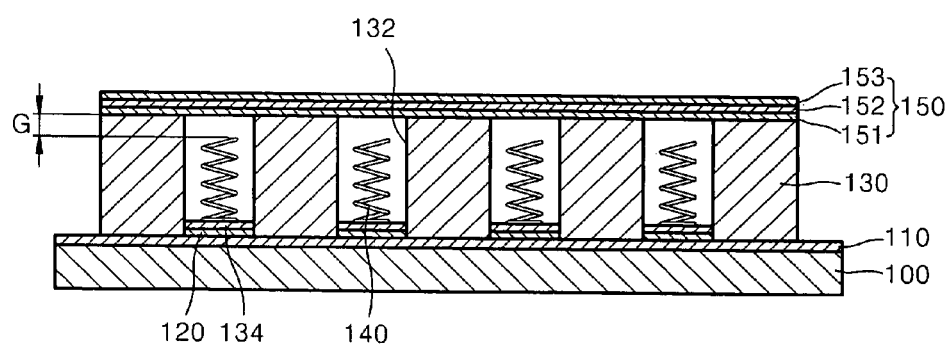
FIG. 2 is an example cross-sectional view taken along line II-II of FIG. 1.

FIG. 1 is a perspective view of an array of nano-elastic memory devices that use nano-coils according to an example embodiment of the present invention, and FIG. 2 is an example cross-sectional view taken along line II-II of FIG. 1. A support unit including a plurality of cavities is shown in FIG. 2 but not shown in FIG. 1.

Referring to FIGS. 1 and 2, an insulating layer 110 formed of a material, for example, silicon oxide $SiO_2$ may be formed on a substrate 100. A plurality of parallel stripe-shaped lower electrodes 120 may be formed at a desired or predetermined interval on the insulating layer 110. A support unit 130 may be formed on the insulating layer 110. Cavities 132 that expose the lower electrodes 120 may be formed in the support unit 130. The support unit 130 may maintain a distance between the lower electrodes 120 and upper electrodes 150, which will be described later, and may support the upper electrodes 150 on the substrate 100. The support unit 130 may be formed of a material, for example, silicon nitride $Si_3N_4$, having an etch selectivity different from the insulating layer 110. The substrate 100 may be a silicon substrate or a SOI substrate, for example.

As shown in FIG. 2, a nano-coil 140 grown approximately vertically from a catalyst metal 134 on the lower electrodes 120 may be formed in the cavity 132. The catalyst metal 134 may be a metal containing at least one of nickel (Ni), iron (Fe), and cobalt (Co). When the lower electrode 120 is formed of a catalyst metal, the catalyst metal 134 may be omitted.

The nano-coil 140 may be formed of a conductive material, and may be referred to as a nano-spring. The nano-coil 140 may be made of carbon nanotubes (CNTs) or other conductive materials, the length of which may be changed by an electrostatic force. At least one nano-coil 140 may be formed in each cavity 132. The nano-coil 140 may have a diameter of 1 nm to 1 μm depending on its growing conditions.

The upper electrode 150 facing the nano-coils 140 may be formed on the support unit 130. The upper electrode 150 may cross the lower electrodes 120 above the cavities 132. A switching device (not shown), for example, a transistor or a diode, may be connected to the upper electrode 150 and the lower electrode 120, and one or more cells of the memory device may be selected using the switching device.

According to an example embodiment of the present invention, a gap G between an upper end of the nano-coil 140 and the upper electrode 150 may be between 1 and 200 nm in an initial state. The gap G may vary according to various factors, such as a spring constant of the nano-coil 140, for example. Also, a threshold voltage for driving the nano-coil 140 may vary with the gap G and the elastic force of the nano-coil 140.

The upper electrode 150 may include a lower metal layer 151 facing the nano-coil 140, an insulating layer 152 on the lower metal layer 151, and an upper metal layer 153 on the insulating layer 152. Accordingly, the lower electrodes 120 and the lower metal layer 151 may form an array having a desired or predetermined width substantially identical to at least the width of the cavity 132.

The lower metal layer 151 may have the same stripe shape as the lower electrodes 120, and the insulating layer 152 and the upper metal layer 153 may have a flat panel shape according to an example embodiment of the present invention. That is, the insulating layer 152 and the upper metal layer 153 need not be etched into the same shape as the lower metal layer 151.

If a voltage is applied to the lower metal layer 151, the upper metal layer 153 may induce an electric charge of the opposite polarity to the lower metal layer 151 and help the lower metal layer 151 collect electric charge.

For example, the upper metal layer 153 may help the nano-coil 140 and the lower metal layer 151 collect electric charge during an erasing operation and may help the lower metal layer 151 collect electric charge during a writing operation. If electric charge is collected at the nano-coil 140 and the lower metal layer 151, an electrostatic force, e.g., a Coulomb force, may be relatively strong. Accordingly, switching may be possible at a lower voltage.

Although the above description is related to a nonvolatile memory device that uses nano-coils, the same structure using the nano-coils may be applied to a switching device.

The operation of an example nano-elastic memory device will now be described.

Figure 3:
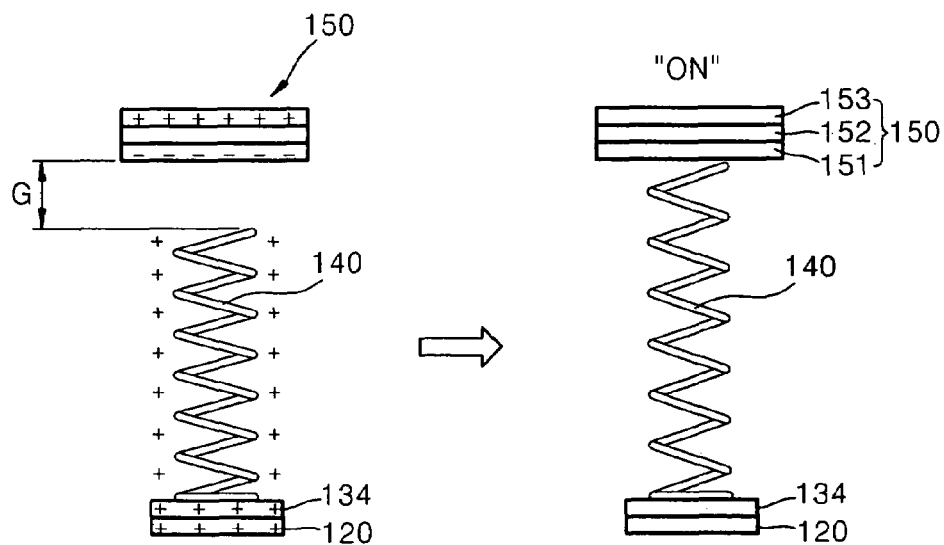
FIGS. 3 and 4 explain methods of writing and erasing information in a nano-elastic memory device according to an example embodiment of the present invention.
Figure 4:
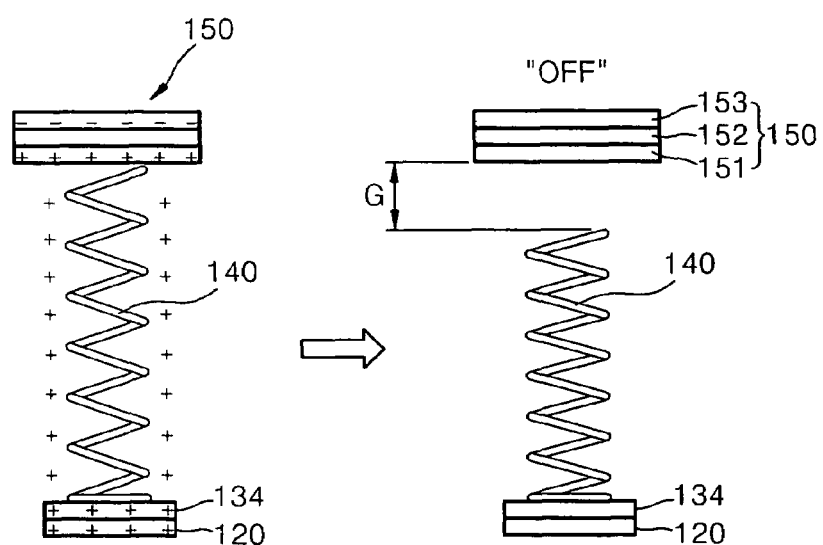
Figure 5:
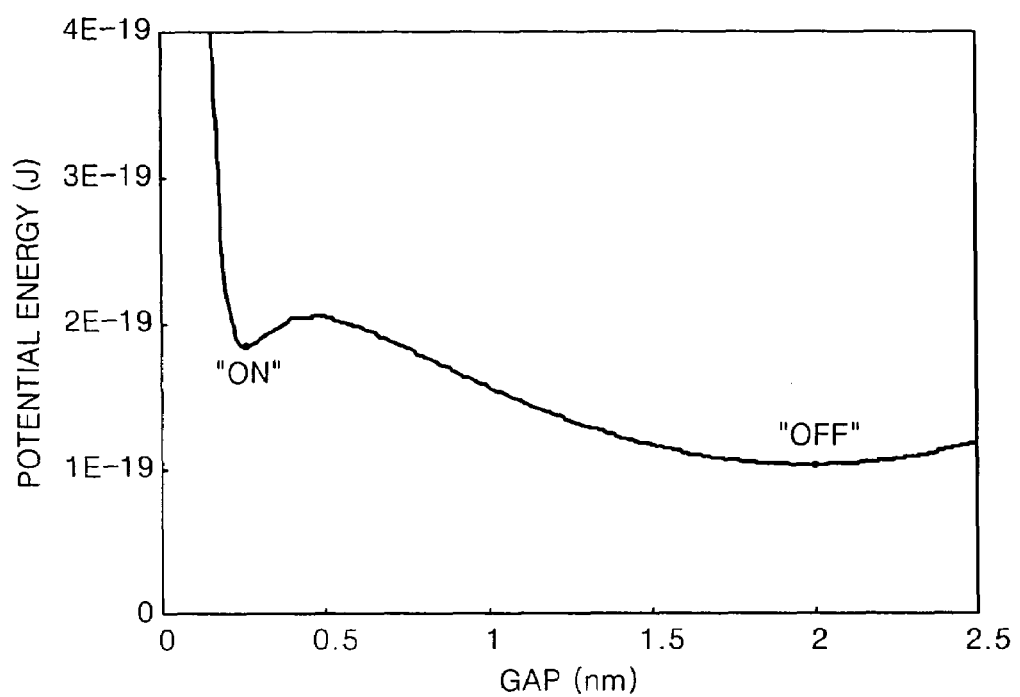
FIGS. 5 through 7 are graphs showing simulation results of the potential energy of nano-coils according to example embodiments of the present invention.
Figure 6:
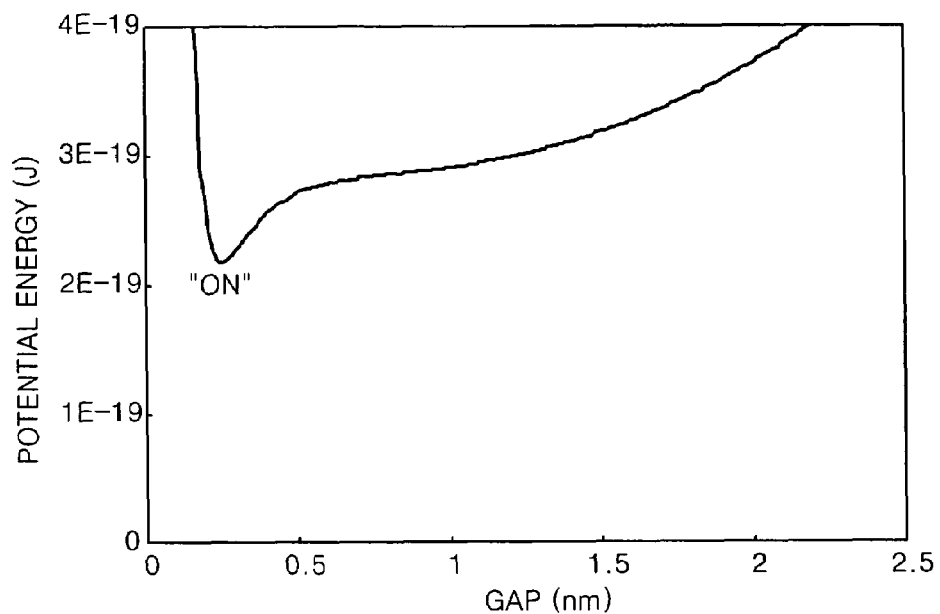
Figure 7:
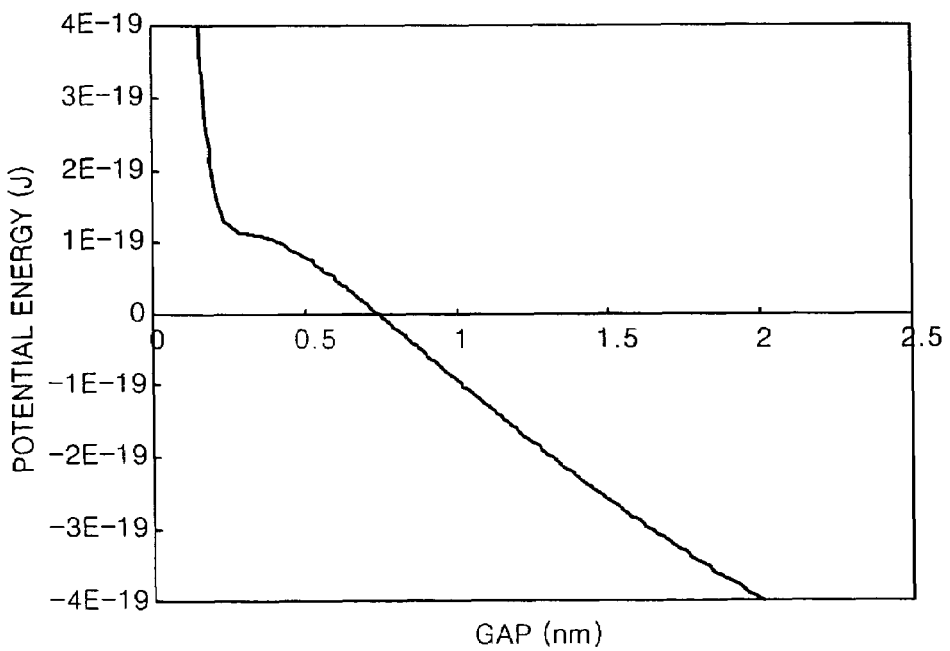

FIGS. 3 and 4 explain methods of writing and erasing information in a nano-elastic memory device according to an example embodiment of the present invention, and FIGS. 5 through 7 are graphs showing simulation results of the potential energy of nano-coils according example embodiments of to the present invention.

Referring to FIG. 3, to perform a writing operation, the lower electrode 120 may be connected to a positive (+) power source and the lower metal layer 151 of the upper electrode 150 may be connected to a negative (−) power source to supply voltages of opposite polarity to the lower electrode 120 and the lower metal layer 151 of the upper electrode 150. In this example, the nano-coil 140 has a positive polarity induced by the positive polarity of the lower electrode 120, and the nano-coil 140 and the lower metal layer 151 are electrically connected due to an electrostatic attractive force therebetween. That is, the cell is in an "ON" state ('1'). At this time, the upper metal layer 153 has the positive polarity. The connection between the nano-coil 140 and the lower metal layer 151 may be maintained by Van der Waals' Force, even if the power is turned off.

Referring to FIG. 4, to perform an erasing operation, the lower electrode 120 and the lower metal layer 151 of the upper electrode 150 may both be connected to a positive (+) power source to supply voltages of the same polarity to the lower electrode 120 and the lower metal layer 151. In this example, the nano-coil 140 and the lower metal layer 151 are separated by an electrostatic repulsive force therebetween and the elastic restoring force of the nano-coil 140. Accordingly, the cell is in an 'OFF' state ('0'). At this time, as described above, the upper metal layer 153 has a negative polarity, opposite to the lower metal layer 151, and helps the lower metal layer 151 collect positive electric charge, thereby aiding the separation of the nano-coil 140 from the lower metal layer 151.

According to an example embodiment of the present invention, the electrostatic force between the nano-coil 140 and the upper electrode 150 and the elastic force of the nano-coil 140 may be important factors. Therefore, the gap between the nano-coil 140 and the upper electrode 150, the diameter and length of the nano-coil 140, and other characteristics which affect the electrostatic force may be controlled and/or optimized according to specifications such as memory size, operation voltage, etc.

To read "1" or "0", the resistance between the lower electrode 120 and the lower metal layer 151 of the upper electrode 150 may be measured. Accordingly, random access is possible because the two electrodes 120 and 150 cross each other, thereby enabling a non-volatile memory.

Operation of an example nano-elastic memory device will now be described using simulation data. For the simulation, a nano-coil 140 having a diameter of 5 nm, a length of 12 nm, and a coefficient of elasticity of 0.12 N/m is used, and the gap between the nano-coil 140 and the lower metal layer 151 is 2 nm.

Referring to FIG. 5, in an initial 'OFF' state, the nano-coil 140 has a stable potential energy at the initial gap of 2 nm. Referring to FIG. 6, if voltages of opposite polarities, for example, 1.1V, are applied to the lower electrode 120 and the lower metal layer 151 of the upper electrode 150, respectively, the nano-coil 140 moves from the gap of 2 nm to a gap of 0.3 nm, which has a lower potential energy than the gap of 2 nm. If the voltage is removed from the upper electrode 150 and the lower electrode 120, the nano-coil 140 stabilizes at the gap of 0.3 nm. If this state is set as an 'ON' state, the nano-coil 140 is maintained electrically communicating with the upper electrode 150 by Van der Waals' energy.

Further, if a voltage having the same polarity, for example, 1.5V, is applied to the lower metal layer 151 of the upper electrode 150 and the lower electrode 120, respectively, a repulsive force is generated between the lower metal layer 151 and the nano-coil 140. At this time, as shown in FIG. 7, the larger the gap, the lower the potential energy of the nano-coil 140. Accordingly, the nano-coil 140 moves to a position at the gap of 2 nm (an off state).

A method of manufacturing a nano-elastic nonvolatile memory device according to an example embodiment of the present invention will now be described.

FIGS. 8A through 10 are cross-sectional views illustrating a method of manufacturing a nano-elastic memory device according to an example embodiment of the present invention.

A method of manufacturing a nano-elastic memory device may include forming a lower structure for manufacturing a nano-coil on a lower electrode, forming an upper structure for manufacturing an upper electrode, and bonding the lower structure together with the upper structure.

Manufacturing the Lower Structure

Figure 8A:
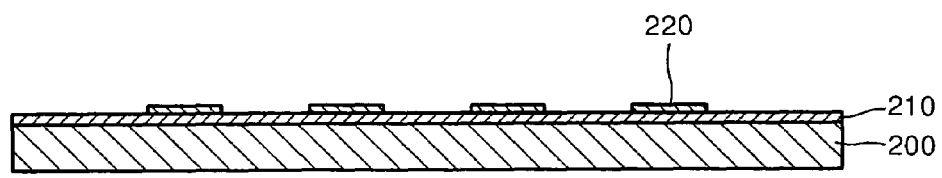
FIGS. 8A through 10 are example cross-sectional views illustrating a method of manufacturing a nano-elastic memory device according to an example embodiment of the present invention.

Referring to FIG. 8A, an insulating layer, for example, a silicon oxide layer 210 may be formed on a first substrate 200, for example, a silicon substrate. The oxide layer 210 may be formed to a thickness of a few nanometers to a few micrometers. A metal layer may be formed on the oxide layer 210 using CVD or sputtering, and stripe-shaped lower electrodes 220 may be formed in parallel by patterning the metal layer. The lower electrode 220 may be formed of nickel (Ni), iron (Fe), or cobalt (Co). The lower electrode 220 may be used as a catalyst metal for growing a nano-coil 240. Also, a catalyst metal layer (not shown) may further be formed on the lower electrode 220. The material for forming the lower electrode 220 may be a material generally used for forming an electrode of a memory device, and there are no specific limitations.

Figure 8B:
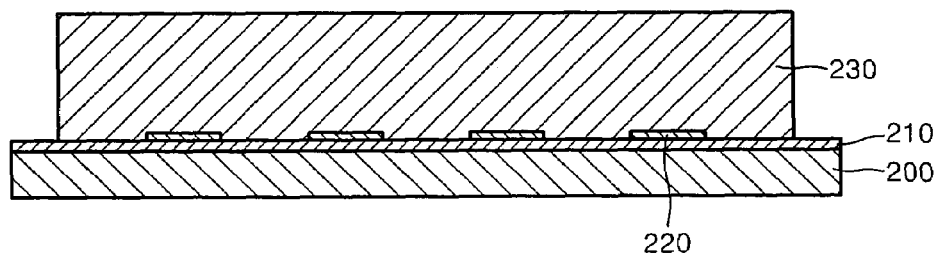

Referring to FIG. 8B, an insulating layer 230 covering the lower electrode 220 may be formed on the oxide layer 210. The insulating layer 230 may be formed of $Si_3N_4$, for example.

Figure 8C:
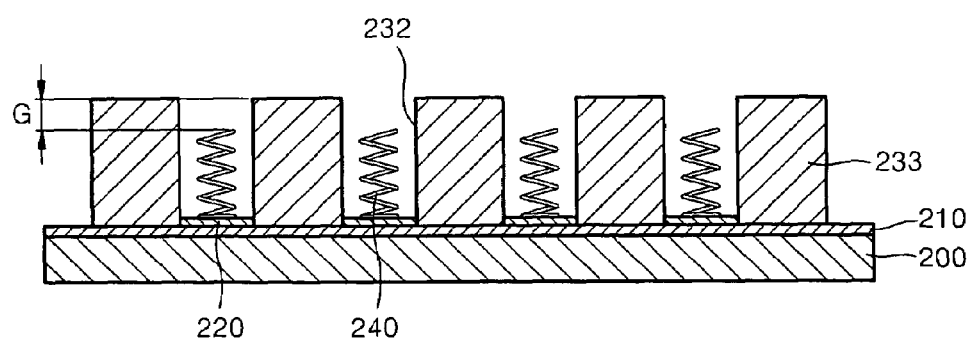

Referring to FIG. 8C, a support unit 233 having cavities 232 that expose the lower electrodes 220 may be formed by patterning the insulating layer 230. A nano-coil 240 may be formed vertically on the surface of the lower electrode 220 in the cavity 232. The cavity 232 may be a contact hole shape or a polygon shape, and the nano-coil 240 may have a diameter of 1 nm to 1 μm. The gap G between an upper end of the nano-coil 240 and an upper surface of the insulating layer 230 may be 1 to 200 nm. For this purpose, a height of the insulating layer 230 may be controlled by chemical mechanical polishing (CMP), for example. The nano-coil 240 may be grown using thermal chemical vapor deposition (thermal CVD) method or plasma enhanced chemical vapor deposition (PECVD). The resultant product may be placed in a reactor, and the nano-coil 240 formed of a carbon nanotube (CNT) is grown in the reactor by injecting a gas containing carbon while the reactor is held at a temperature of 500 to 900° C. The gas containing carbon may be methane $CH_4$, acetylene $C_2H_2$, ethylene $C_2H_4$, ethane $C_2H_6$, or carbon monoxide CO. The nano-coil 240 may be formed by known processes, for example, those disclosed in U.S. Pat. No. 6,558,645, the entire contents of which are hereby incorporated by reference.

Manufacturing an Upper Structure

Figure 9A:
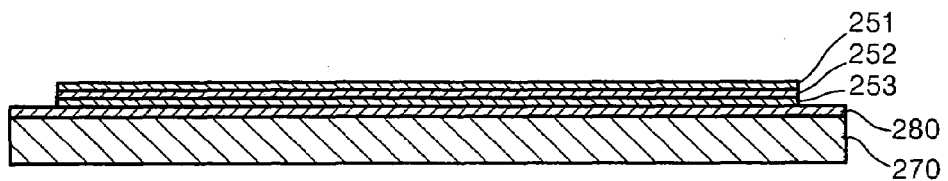

Referring to FIG. 9A, an insulating layer, for example, a silicon oxide layer 280 may be formed on a second substrate 270, for example, a silicon substrate. The oxide layer 280 may be formed to a thickness of a few nanometers to a few micrometers. A substantially flat first metal layer 253 may be formed of a conductive metal on the oxide layer 280 by CVD or sputtering. An insulating layer 252 and a second metal layer 251 may be sequentially formed on the first metal layer 253.

Figure 9B:
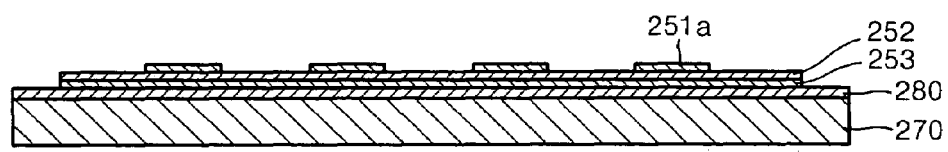

Referring to FIG. 9B, a second metal layer pattern 251' having a parallel stripe shape may be formed by patterning the second metal layer 251. The width of the second metal layer pattern 251' may be approximately the same as the diameter of the cavity 232. The materials for forming the first and second metal layers 251 and 253 may be those generally used for forming an electrode of a memory device, and there are no specific limitations.

Bonding the Lower Structure and the Upper Structure

Figure 10:
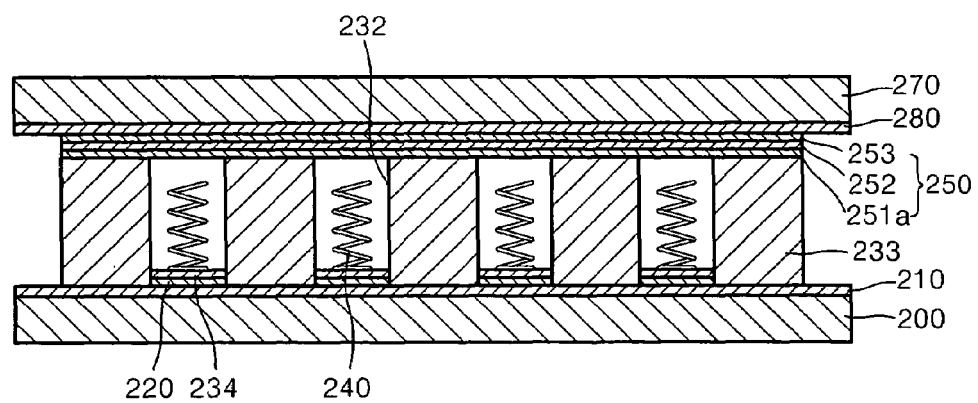

Referring to FIG. 10, the second metal layer pattern 251' may be aligned to face the first substrate 200 and the second substrate 270 may be bonded to the first substrate 200, for example, by anodic bonding. The first substrate 200 and the second substrate 270 may be bonded so that the second metal layer pattern 251' perpendicularly crosses the lower electrode 220 above the nano-coil 240, that is, the second metal layer pattern 251' may cross over the cavity 232.

FIGS. 11A through 11F are cross-sectional views illustrating a method of manufacturing a nano-elastic memory device according to another example embodiment of the present invention.

Figure 11A:
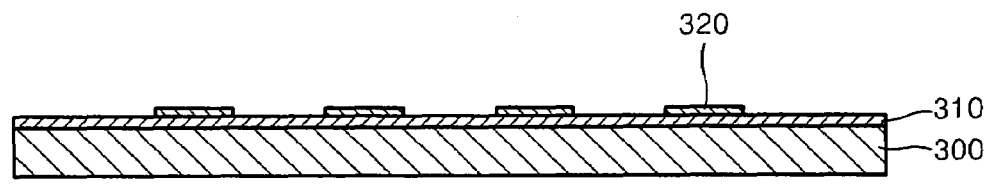
FIGS. 11A through 11F are example cross-sectional views illustrating a method of manufacturing a nano-elastic memory device according to another example embodiment of the present invention.

Referring to FIG. 11A, an insulating layer, for example, a silicon oxide layer 310 may be formed on a silicon substrate 300, for example. The oxide layer 310 may be formed to a thickness of a few nanometers to a few micrometers.

After a metal layer is formed on the oxide layer 310 using CVD or sputtering, a parallel stripe-shaped lower electrode 320 may be formed by patterning the metal layer. The lower electrode 320 may be formed of nickel (Ni), iron (Fe), or cobalt (Co). The lower electrode 320 may be used as a catalyst metal for growing a nano-coil 340. Also, a catalyst metal layer (not shown) may further be formed on the lower electrode 320. The materials for forming the lower electrode 320 may be those generally used for forming an electrode of a memory device, and there are no specific limitations.

Figure 11B:
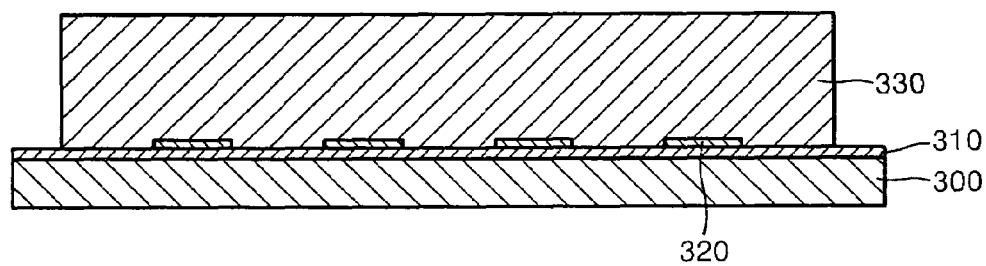

Referring to FIG. 11B, an insulating layer 330 covering the lower electrode 320 may be formed on the oxide layer 310. The insulating layer 330 may be formed of $Si_3N_4$, for example.

Figure 11C:
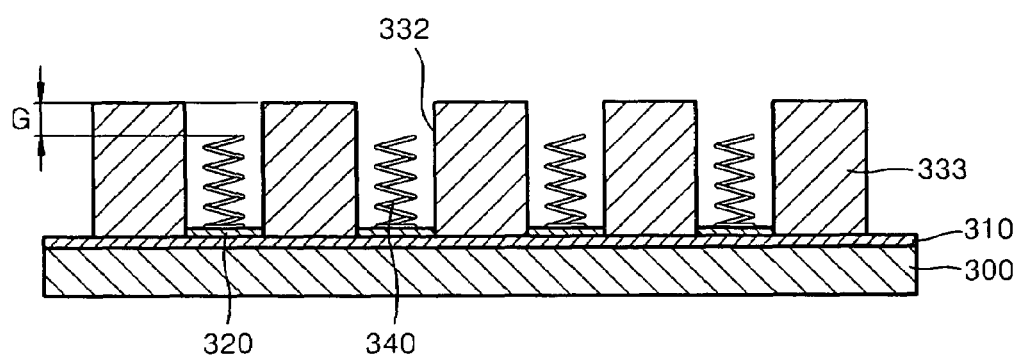

Referring to FIG. 11C, a support unit 333 having cavities 332 that expose the lower electrodes 320 may be formed by patterning the insulating layer 330. The nano-coil 340 may be grown vertically on the surface of the lower electrode 320 in the cavity 332. The cavity 332 may be elongated along the lower electrode 320. The nano-coil 340 may have a diameter of about 1 nm to about 1 μm. A gap G between an upper end of the nano-coil 340 and an upper surface of the support unit 333 may be about 1 to about 200 nm. The nano-coil 340 may be manufactured using the method described with reference to FIG. 8C.

Figure 11D:
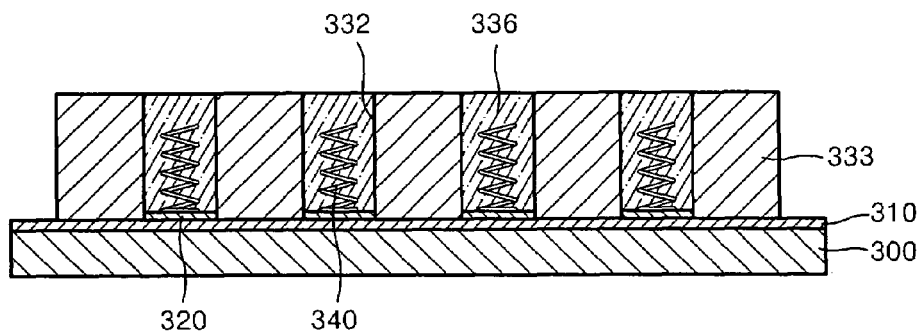

Referring to FIG. 11D, a sacrificial layer 336 may be formed in the cavity 332. The sacrificial layer 336 may be a photoresist.

Figure 11E:
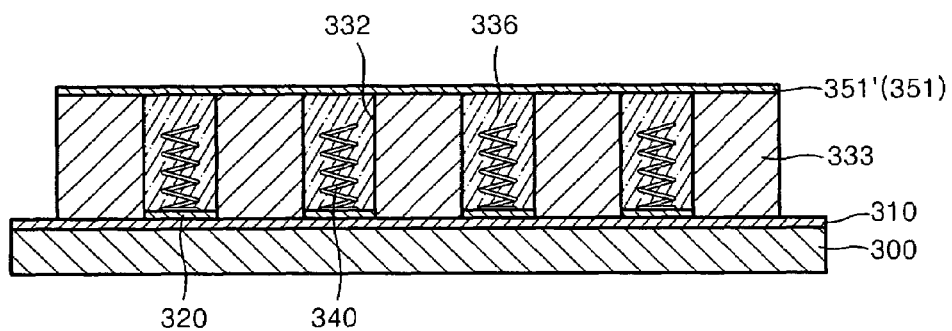

Referring to FIG. 11E, after a first metal layer 351 is deposited on the support unit 333 and the sacrificial layer 336, a first metal pattern 351' may be formed by patterning the first metal layer 351 so that the first metal pattern 351' may cross over the nano-coil 340 as well as the lower electrode 320 and the cavity 332. The first metal pattern 351' may have the same width has the lower electrode 320. The sacrificial layer 336 may be removed. Accordingly, the first metal pattern 351' may have a bridge shape crossing over the nano-coil 340.

Figure 11F:
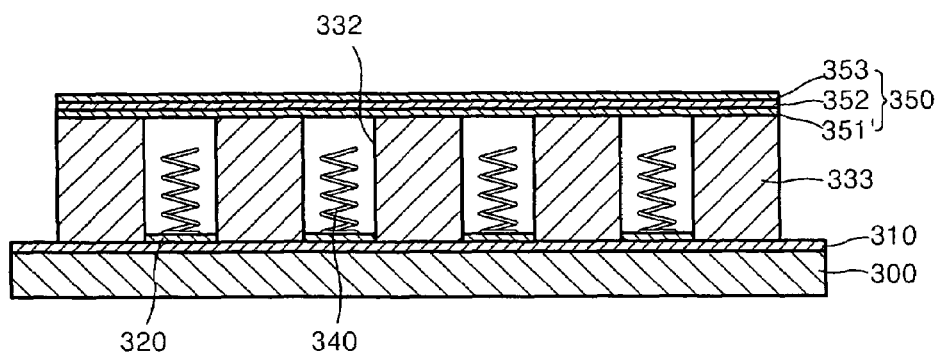

Referring to FIG. 11F, an upper electrode 350 may be formed by sequentially forming an insulating layer 352 and a second metal layer 353 covering the first metal pattern 351' on the support unit 333. The insulating layer 352 may be formed by forming an insulating layer on the substrate 300 and planarizing the insulating layer. The upper electrode 350 may be completed by forming the second metal layer 353 on the insulating layer 352. The insulating layer 352 may fill a portion of the cavity 332 not covered by the first metal pattern 351' and separate the nano-coils 340 from each other.

A nano-elastic memory device according example embodiments of the present invention may store information using a nano-elastic body (for example, a CNT coil) between two electrodes, and varying the length of the elastic body using an electrostatic force and an elastic force of the CNT coil, to electrically connect and disconnect the two electrodes.

According to the nano-elastic memory device and the method of manufacturing the nano-elastic memory device according to example embodiments of the present invention, a nonvolatile memory device may be manufactured using coil shaped nanotubes.

Also, nano-elastic memory device according to example embodiments of the present invention may be operated at a lower driving voltage than a conventional memory device that uses a plurality of ribbon shaped CNTs, because the nano-elastic memory device according to the example embodiments of the present invention may use fewer coil shaped nanotubes, and memory cells are not mutually affected because the CNT coils are formed independently in each unit cell.

Also, the nano-elastic memory device according to example embodiments of the present invention may be more reliable than a conventional ribbon type device, because the nano-elastic memory device makes use of a mechanical characteristic (vertical length change) of the CNT coil. Also, the degree of integration of the CNT coil may be higher than in the conventional art, because the CNT coil in the cavity may be formed to have a diameter of a few tens of nanometers.

While the present invention has been particularly shown and described with reference to example embodiments thereof, it will be understood by those of ordinary skill in the art that various changes in form and detail may be made therein without departing from the spirit and scope of the present invention.

What is claimed is:

1. A nano-elastic memory device comprising:
   at least one lower electrode;
   at least one upper electrode vertically separated from the at least one lower electrode, the at least one lower electrode perpendicularly crosses the at least one upper electrode; and
   at least one nano-elastic body grown on one of the at least one lower electrode and the at least one upper electrode towards the other of the at least one lower electrode and the at least one upper electrode.

2. The nano-elastic memory device of claim 1, wherein the at least one nano-elastic body is formed in a coil shape.

3. The nano-elastic memory device of claim 1, wherein the at least one nano-elastic body is a conductive nanotube.

4. The nano-elastic memory device of claim 3, wherein the at least one nano-elastic body is a carbon nanotube (CNT).

5. The nano-elastic memory device of claim 1, further comprising a catalyst metal layer arranged on a lower part of the at least one nano-elastic body.

6. The nano-elastic memory device of claim 1, wherein the one of the at least one lower electrode and the at least one upper electrode on which the at least one nano-elastic body is formed includes a catalyst metal layer.

7. The nano-elastic memory device of claim 1, wherein one of the at least one upper electrode and the at least one lower electrode has a stack structure including a first conductive film, an insulating layer, and a second conductive film.

8. The nano-elastic memory device of claim 1, further comprising at least one switching device connected to the at least one upper electrode and the at least one lower electrode to selectively change a length of the at least one nano-elastic body.

9. The nano-elastic memory device of claim 8, wherein the at least one switching device is one of a transistor and a diode.

10. The nano-elastic memory device of claim 1, further comprising:
a substrate;
a support unit interposed between the at least one lower electrode and the at least one upper electrode, formed of an insulating material on the substrate and having cavities that expose the one of the at least one lower electrode and the at least one upper electrode; and
wherein the at least one nano-elastic body is arranged in the cavities.

11. The nano-elastic memory device of claim 10, wherein the substrate is one of a SOI substrate and a silicon substrate.

12. The nano-elastic memory device of claim 11, further comprising an insulating layer between the substrate and the one of the at least one lower electrode and the at least one upper electrode.

13. The nano-elastic memory device of claim 10, wherein the cavities are elongated along the one of the at least one lower electrode and the at least one upper electrode.

14. The nano-elastic memory device of claim 10, wherein the cavities have one of a contact hole shape and a polygon shape.

15. The nano-elastic memory device of claim 2, wherein the at least one nano-elastic body has a diameter of 1 nm to 1 µm.

16. The nano-elastic memory device of claim 10, wherein the at least one nano-elastic body at a region where the at least one lower electrode and the at least one upper electrode cross each other is a plurality of nano-elastic bodies.

17. The nano-elastic memory device of claim 10, wherein the gap between the at least one nano-elastic body and the other of the at least one lower electrode and the at least one upper electrode is 1 to 200 nm.

* * * * *